(12) United States Patent
Liu et al.

(10) Patent No.: US 11,310,922 B2
(45) Date of Patent: Apr. 19, 2022

(54) BOARD-TO-BOARD CONNECTING STRUCTURE AND METHOD FOR MANUFACTURING THE SAME

(71) Applicants: Avary Holding (Shenzhen) Co., Limited., Shenzhen (CN); QING DING PRECISION ELECTRONICS (HUAIAN) CO., LTD, Huai an (CN)

(72) Inventors: Rui-Wu Liu, Huaian (CN); Man-Zhi Peng, Huaian (CN)

(73) Assignees: Avary Holding (Shenzhen) Co., Limited., Shenzhen (CN); QING DING PRECISION ELECTRONICS (HUAIAN) CO., LTD, Huai an (CN)

( * ) Notice: Subject to any disclaimer, the term of this patent is extended or adjusted under 35 U.S.C. 154(b) by 98 days.

(21) Appl. No.: 17/027,929

(22) Filed: Sep. 22, 2020

(65) Prior Publication Data
US 2022/0061167 A1     Feb. 24, 2022

(30) Foreign Application Priority Data
Aug. 19, 2020   (CN) .......................... 202010839013.3

(51) Int. Cl.
| | |
|---|---|
| *H05K 1/02* | (2006.01) |
| *H05K 3/46* | (2006.01) |
| *H05K 1/11* | (2006.01) |
| *H05K 1/09* | (2006.01) |

(52) U.S. Cl.
CPC ......... *H05K 3/4623* (2013.01); *H05K 1/0298* (2013.01); *H05K 1/092* (2013.01); *H05K 1/112* (2013.01); *H05K 3/4614* (2013.01); *H05K 2201/10984* (2013.01); *H05K 2203/041* (2013.01); *H05K 2203/068* (2013.01)

(58) Field of Classification Search
CPC ...... H05K 1/112; H05K 1/0298; H05K 1/092; H05K 3/4614; H05K 3/4623
See application file for complete search history.

(56) References Cited

U.S. PATENT DOCUMENTS

| | | | | |
|---|---|---|---|---|
| 2006/0289200 | A1* | 12/2006 | Lee ...................... | H05K 3/4007 174/258 |
| 2009/0090548 | A1* | 4/2009 | Shih ..................... | H05K 3/4661 216/17 |

* cited by examiner

*Primary Examiner* — Jeremy C Norris
(74) *Attorney, Agent, or Firm* — ScienBiziP, P.C.

(57) ABSTRACT

A board-to-board connecting structure which adds no significant thickness to a single printed circuit board includes a first circuit board and a second circuit board. The first circuit board includes first circuit substrate, adhesive layer, and second circuit substrate. The first circuit substrate includes first base layer, first inner wiring layer with first pad, and first outer wiring layer defining a receiving space. The second circuit substrate includes insulating layer and two second outer wiring layers. A conductive via in the second circuit substrate connects the two second outer wiring layers. The second circuit board includes second base layer and also two third outer wiring layers each with a second pad. The second circuit board is laterally disposed in the receiving space and one second pad connects to the conductive via and the other to the first pad.

14 Claims, 11 Drawing Sheets

BOARD-TO-BOARD CONNECTING STRUCTURE AND METHOD FOR MANUFACTURING THE SAME

FIELD

The subject matter herein generally relates to printed circuit boards, and more particularly, to a board-to-board connecting structure and a method for manufacturing the board-to-board connecting structure.

BACKGROUND

Electronic devices, such as mobile phones, tablet computers, or personal digital assistants, may have more than one circuit board. To improve the performance of the electronic device, circuit boards with different functions may need to be connected together.

The circuit boards may be connected together by anisotropic conductive film (ACF), pulse hot-press welding (hot-bar), or connectors, but this may increase the thickness of the product. Improvement in the art is desired.

BRIEF DESCRIPTION OF THE DRAWINGS

Implementations of the present technology will now be described, by way of embodiment, with reference to the attached figures.

DETAILED DESCRIPTION

Figure 1:
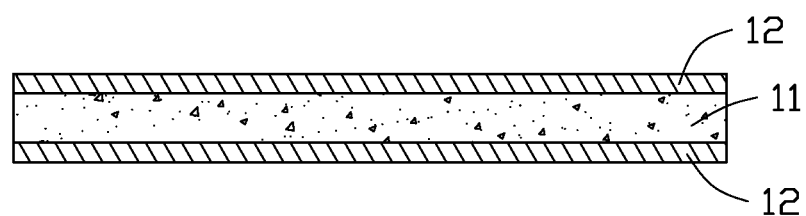
FIG. 1 is a diagrammatic view of an embodiment of a first double-sided copper clad laminate.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 24:
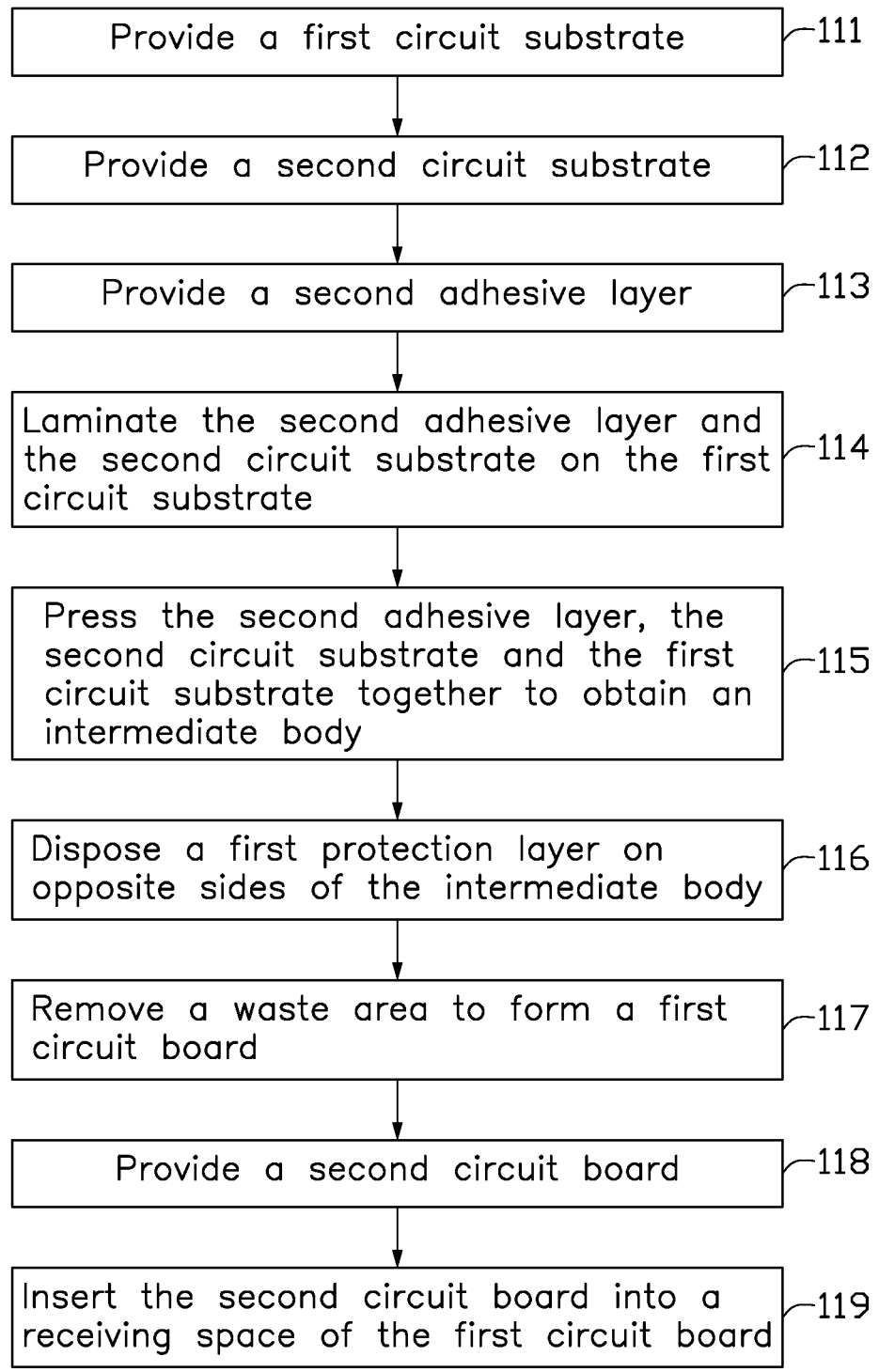
FIG. 24 is a flowchart of an embodiment of a method for manufacturing a board-to-board connecting structure.

Referring to FIG. 24, a method for manufacturing a board-to-board connecting structure is presented in accordance with an embodiment. The method is provided by way of example, as there are a variety of ways to carry out the method. The method can begin at block 11.

Figure 6:
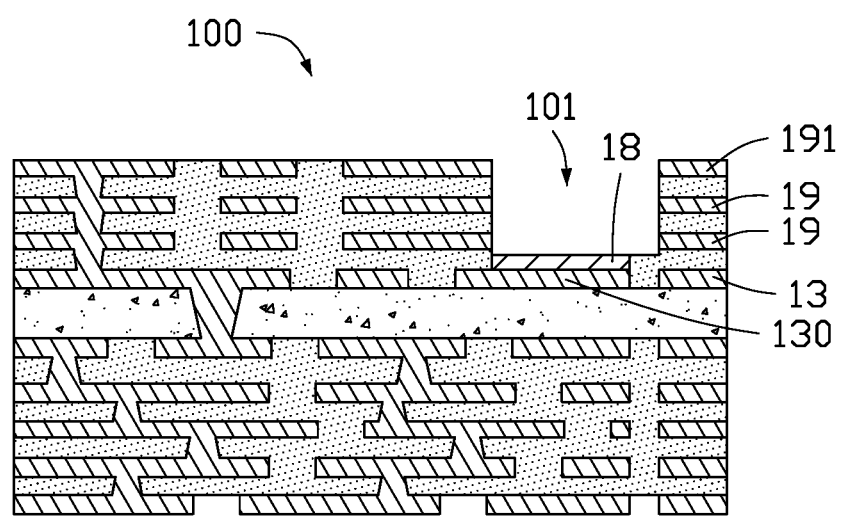
FIG. 6 is a diagrammatic view showing the second copper foil layer of FIG. 5, etched to obtain a first circuit substrate.

Block 111, referring to FIG. 6, a first circuit substrate 100 is provided. The first circuit substrate 100 includes a first base layer 11 and two first inner wiring layers 13 disposed on two opposite surfaces of the first base layer 11. A first outer wiring layer 191 is disposed on each first inner wiring layer 13. The first inner wiring layer 13 includes a first pad 130. A release film 18 is disposed on the first pad 130. The first circuit substrate 100 defines a first opening 101 above the release film 18. The release film 18 is exposed from the first opening 101.

In an embodiment, the first circuit substrate 100 is manufactured as follows.

Referring to FIG. 1, a first double-sided copper clad laminate 10 is provided. The first double-sided copper clad laminate 10 includes the first base layer 11 and two first copper foil layers 12 disposed on the two opposite surfaces of the first base layer 11. The first base layer 11 can be made of an insulating resin resistant to high temperatures, such as polyimide (PI) and liquid crystal polymer (Liquid Crystalline Polymer, LCP). The first base layer 11 can also be made of an insulating resin which is not resistant to high temperatures, such as polyethylene Terephthalate (PET) and polyethylene Naphthalate (PEN).

Figure 2:
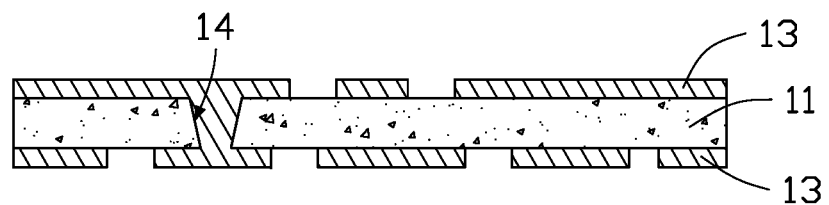
FIG. 2 is a diagrammatic view showing a first copper foil layer of the first double-sided copper clad laminate of FIG. 1, etched to obtain a first inner wiring layer.

Referring to FIG. 2, each first copper foil layer 12 is etched to form a first inner wiring layer 13. In an embodiment, the first inner wiring layer 13 is formed by a subtractive method, which includes steps of drilling the first double-sided copper clad laminate 10, surface treatment, copper electroplating, dry film covering, pattern transferring, and dry film removing. After drilling and copper electroplating, a first conductive blind hole 14 is formed in the first base layer 11. Two first inner wiring layers 13 are electrically connected to each other through the first conductive blind hole 14.

Figure 3:
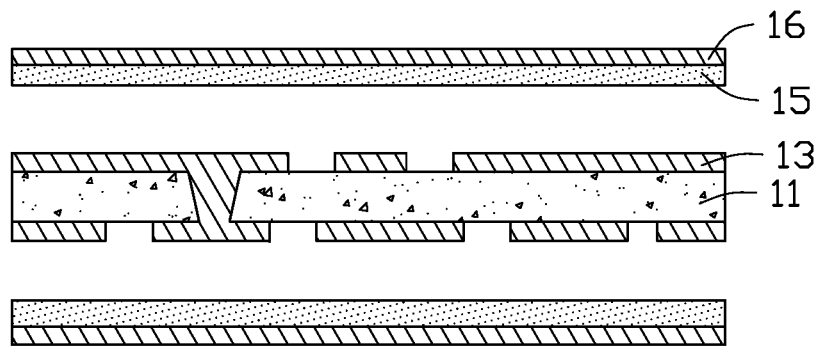
FIG. 3 is a diagrammatic view showing a first adhesive layer and a second copper foil layer formed on the first inner wiring layer of FIG. 2.
Figure 4:
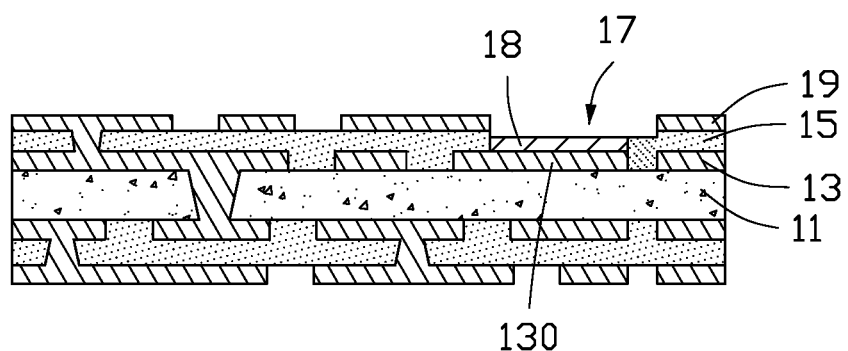
FIG. 4 is a diagrammatic view showing the second copper foil layer of FIG. 3, etched to obtain a first middle wiring layer.

Referring to FIGS. 3 and 4, a first adhesive layer 15 and a second copper foil layer 16 are disposed on each first inner wiring layer 13. The first adhesive layer 15 is between the second copper foil layer 16 and the first inner wiring layer 13. The first adhesive layer 15 and the second copper foil layer 16 above one of the first inner wiring layers 13 define a slot 17. The release film 18 is exposed from the slot 17 (that is, the release film 18 is disposed in the slot 17). In an embodiment, the release film 18 is first disposed on the first pad 130 of the first inner wiring layer 13. The first adhesive layer 15 and the second copper foil layer 16 are then disposed on each first inner wiring layer 13. Portions of the first adhesive layer 15 and the second copper foil layer 16 corresponding to the release film 18 then define the slot 17.

Figure 5:
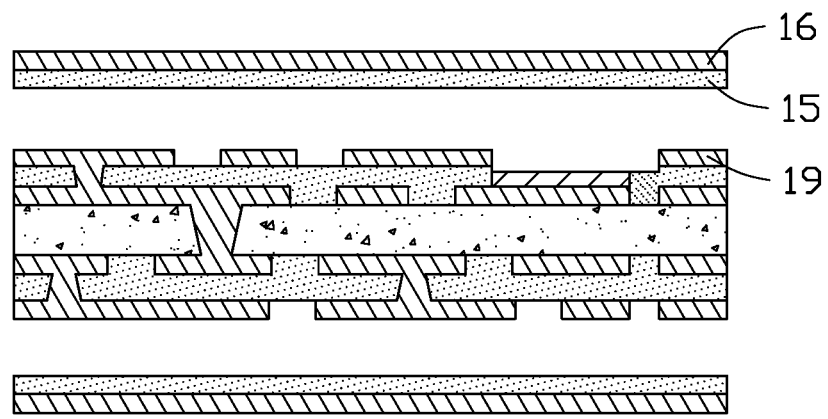
FIG. 5 is a diagrammatic view showing another first adhesive layer and another second copper foil layer formed on the first middle wiring layer of FIG. 4.

Referring to FIG. 4, the second copper foil layer 16 is etched to form a first middle wiring layer 19. Referring to FIGS. 5 and 6, at least one first adhesive layer 15 and at least one second copper foil layer 16 are continuously disposed on each first middle wiring layer 19 according to the number of wiring layers required in the first circuit substrate 100. Every time that one first adhesive layer 15 and one second copper foil layer 16 are formed, a slot 17 is defined at portions of the first adhesive layer 15 and the second copper foil layer 16 corresponding to the release film 18. Then, at least one first middle wiring layer 19 or a first outer wiring layer 191 is formed by etching the second copper foil layer 16 (that is, a building-up process). Thus, the first circuit substrate 100 is obtained. The slots 17 are connected to each other to form a first window 101 for exposing the release film 18. In other embodiments, when the first circuit substrate 100 includes four wiring layers, the building-up process in FIGS. 5 and 6 can be omitted. That is, the first middle wiring layer in FIG. 4 functions as the first outer wiring layer 191.

Figure 10:
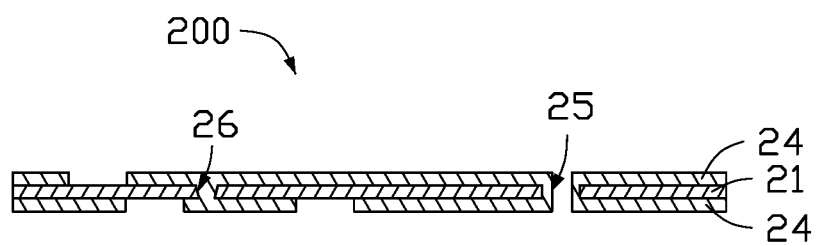
FIG. 10 is a diagrammatic view showing the second copper foil layer and the copper electroplating of the second double-sided copper clad laminate of FIG. 9, etched to obtain a second circuit substrate.

Block 112, referring to FIG. 10, a second circuit substrate 200 is provided. The second circuit substrate 200 includes an insulating layer 21 and two second outer wiring layers 24 disposed on two opposite surfaces of the insulating layer 21. The second circuit substrate 200 defines a conductive via 25, which electrically connects the two second outer wiring layers 24.

In embodiment, the second circuit substrate 200 is manufactured as follows.

Figure 7:
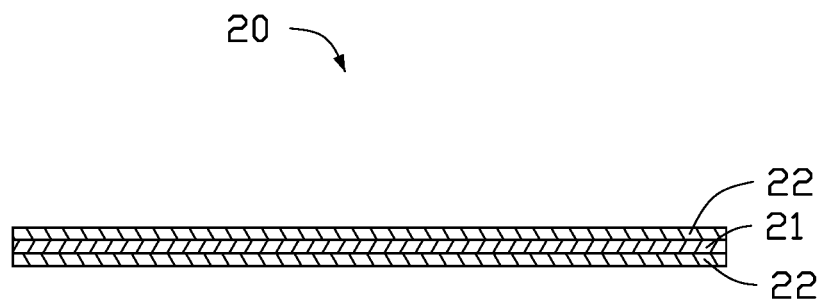
FIG. 7 is a diagrammatic view of an embodiment of a second double-sided copper clad laminate.

Referring to FIG. 7, a second double-sided copper clad laminate 20 is provided. The second double-sided copper clad laminate 20 includes the insulating layer 21 and two third copper foil layers 22 disposed on two opposite surfaces of the insulating layer 21.

Figure 8:
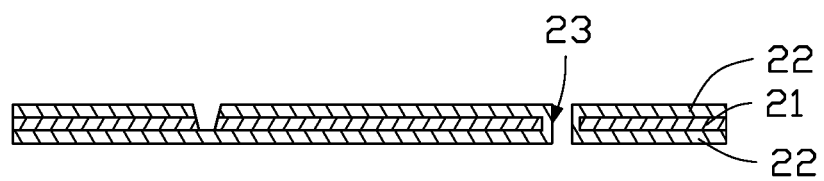
FIG. 8 is a diagrammatic view showing a through hole defined in the second double-sided copper clad laminate of FIG. 7.

Referring to FIG. 8, a through hole 23 is defined in the second double-sided copper clad laminate 20. The through hole 23 penetrates the insulating layer 21 and each third copper foil layer 22.

Figure 9:
FIG. 9 is a diagrammatic view showing copper electroplating on the second double-sided copper clad laminate of FIG. 8.

Referring to FIGS. 8 to 10, each third copper foil layer 22 is etched to form a second outer wiring layer 24, thereby obtaining the second circuit substrate 200. In an embodiment, the second outer wiring layer 24 is formed by a subtractive method, which includes steps of drilling the second double-sided copper clad laminate 20, surface treatment, copper electroplating, dry film covering, pattern transferring, and dry film removing. After drilling and copper electroplating, a second conductive blind hole 26 is also formed in the insulating layer 21. The two second outer wiring layers 24 are electrically connected to each other through the conductive via 25 and the second conductive blind hole 26. The conductive via 25 may be formed by electroplating copper on an inner wall of the through hole 23.

Figure 13:
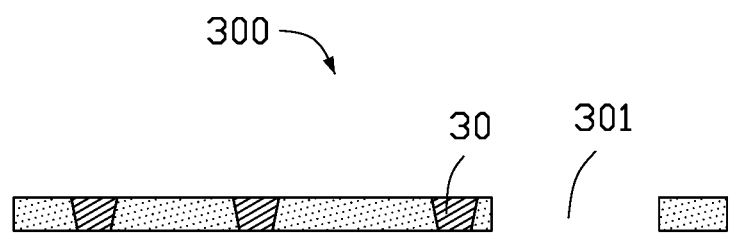
FIG. 13 is a diagrammatic view showing a conductive block disposed in the receiving hole of FIG. 12.

Block 113, referring to FIG. 13, a second adhesive layer 300 is provided. The second adhesive layer 300 defines a second window 301 and a conductive block 30 spaced apart from the second window 301.

In an embodiment, the second adhesive layer 300 is manufactured as follows.

Figure 11:
FIG. 11 is a diagrammatic view of an embodiment of a second adhesive layer.

Referring to FIG. 11, a second window 301 is defined in the second adhesive layer 300.

Figure 12:
FIG. 12 is a diagrammatic view showing a receiving hole defined in the second adhesive layer of FIG. 11.

Referring to FIG. 12, at least one receiving hole 302 is defined in the second adhesive layer 300. The receiving hole 302 is spaced apart from the second window 301.

Referring to FIG. 13, a conductive material is filled in the receiving hole 302, and is solidified to form the conductive block 30. Thereby, the second adhesive layer 300 is obtained. The conductive block 30 may be made of a conductive paste, for example, copper paste, solder paste, or copper-silver alloy paste.

Figure 14:
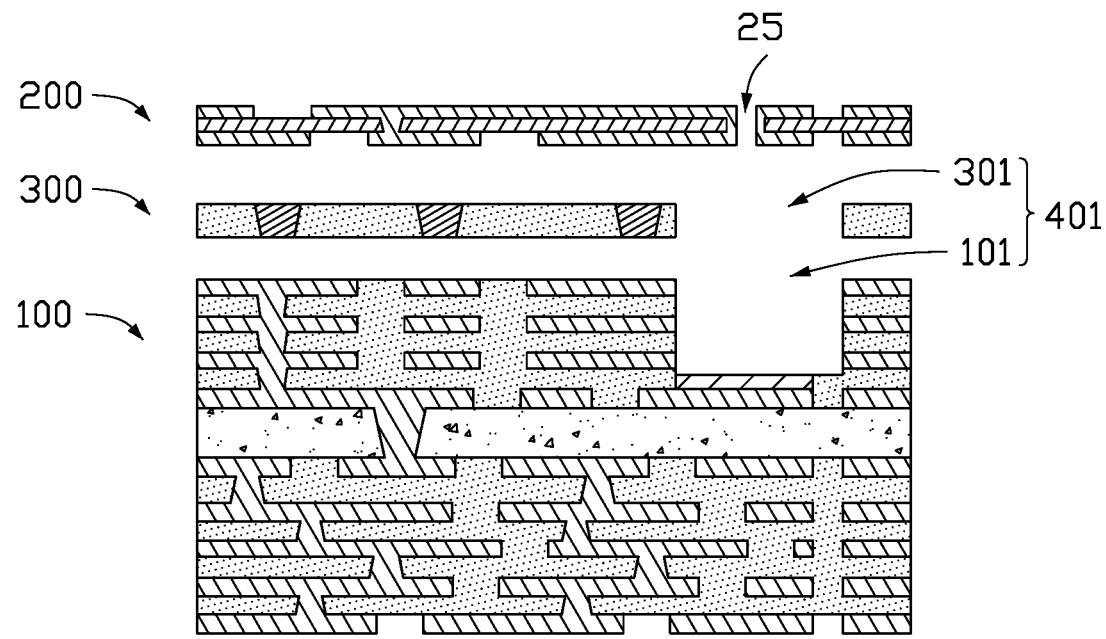
FIG. 14 is a diagrammatic view showing the first circuit substrate of FIG. 6, the second adhesive layer of FIG. 13, and the second circuit substrate of FIG. 10 sequentially stacked.

Block 114, referring to FIG. 14, the second adhesive layer 300 and the second circuit substrate 200 are sequentially laminated on the first outer wiring layer 191 of the first circuit substrate 100 above the release film 18, connecting the second window 301 and the first window 101 to each other to form a receiving space 401, and connecting the conductive via 25 to the receiving space 401.

Figure 15:
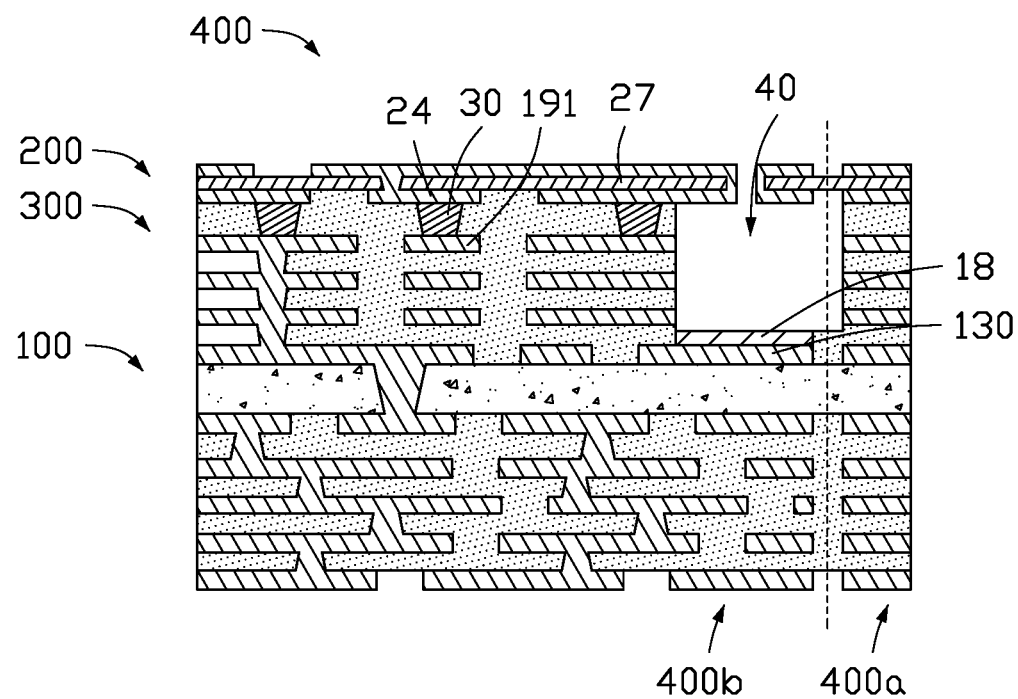
FIG. 15 is a diagrammatic view showing the first circuit substrate, the second adhesive layer, and the second circuit substrate of FIG. 14 pressed together to obtain an intermediate body.

Block 115, referring to FIG. 15, the second adhesive layer 300, the second circuit substrate 200 and the first circuit substrate 100 after lamination are pressed together, the second adhesive layer 300 thus connecting the first circuit substrate 100 to the second circuit substrate 200, and the conductive block 30 of the second adhesive layer 300 thus electrically connecting the second outer wiring layer 24 of the second circuit substrate 200 to the first outer wiring layer 191 of the first circuit substrate 100. Thereby, an intermediate body 400 is obtained.

The second circuit substrate 200 includes a connection area 27 surrounding the conductive via 25. The connection area 27 is disposed above the receiving space 401. The intermediate body 400 also includes a waste area 400a at a side of the receiving space 401, and a product area 400b beside the waste area 400a. The first pad 130, the release film 18, and the connection area 27 are disposed in the product area 400b. In an embodiment, orthogonal projections of the first window 101 and the second window 301 on the first base layer 11 overlap with each other. An orthogonal projection of the conductive via 25 on the first base layer 11 is within the orthogonal projection of the first window 101 on the first base layer 11.

Figure 16:
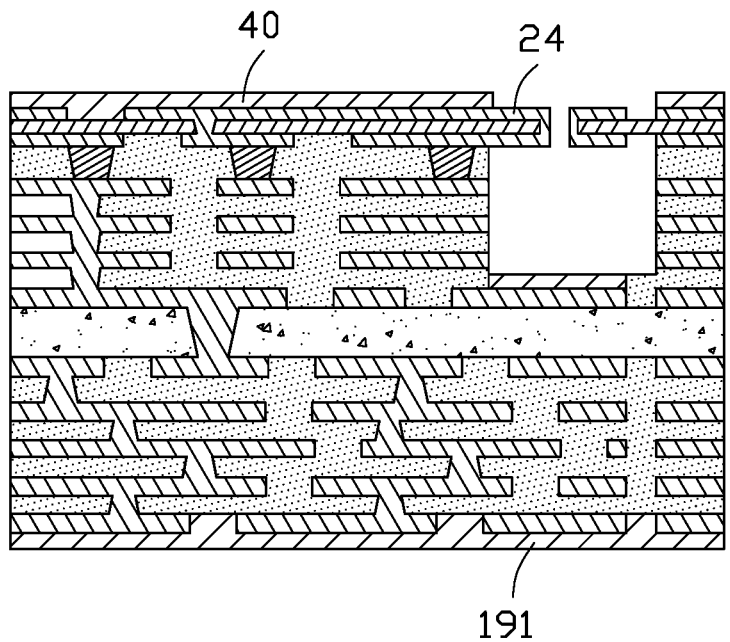
FIG. 16 is a diagrammatic view showing a protective layer formed on each side of the intermediate body of FIG. 15.

Block 116, referring to FIG. 16, a first protection layer 40 is disposed on the first outer wiring layer 191 and the second outer wiring layer 24 on opposite sides of the intermediate body 400.

The first protective layer 40 may include a solder resist ink.

Figure 17:
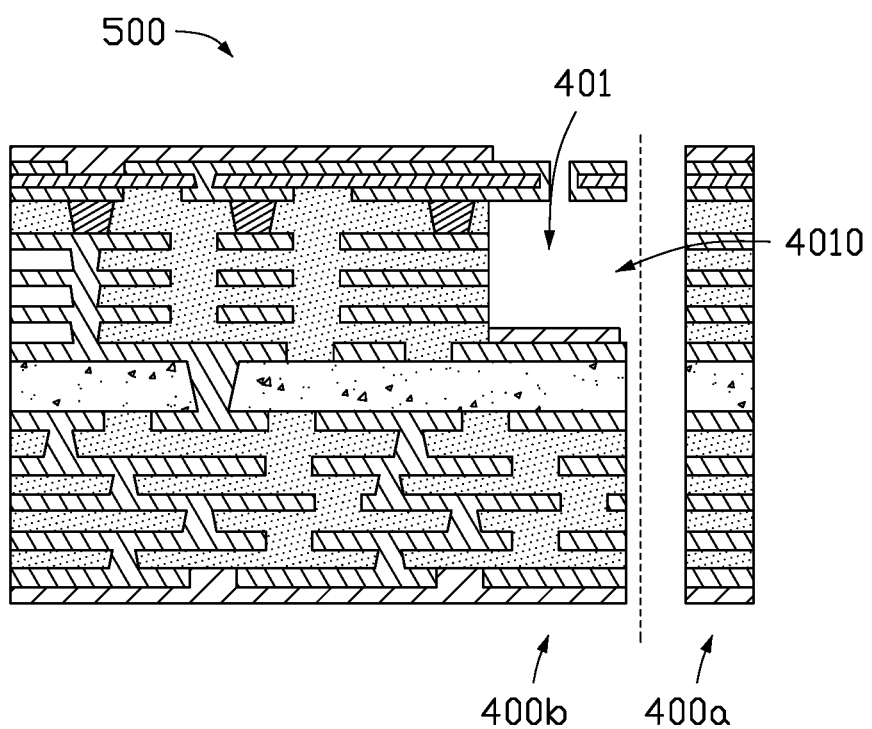
FIG. 17 is a diagrammatic view showing a waste area removed from the intermediate body of FIG. 16 to obtain a first circuit board.

Block 117, referring to FIG. 17, the waste area 400a is removed, the receiving space 401 thus forming an opening 4010. The remaining product area 400b forms the first circuit board 500. The opening 4010 of the receiving space 401 is disposed on a sidewall of the first circuit board 500.

That is, the first circuit board 500 includes the first circuit substrate 100, the second adhesive layer 300, and the second circuit substrate 200 sequentially stacked in that order. The first circuit substrate 100 includes the first base layer 11 and the first inner wiring layers 13 disposed on two opposite surfaces of the first base layer 11. One of the first inner wiring layers 13 includes the first pad 130. The release film 18 is disposed on the first pad 130. The second adhesive layer 300 and the first circuit board 500 define a receiving space 401 exposing the release film 18. The second circuit substrate 200 includes the conductive via 25 and a connection area 27 surrounding the conductive via 25. The connection area 27 is disposed above the receiving space 401.

Figure 22:
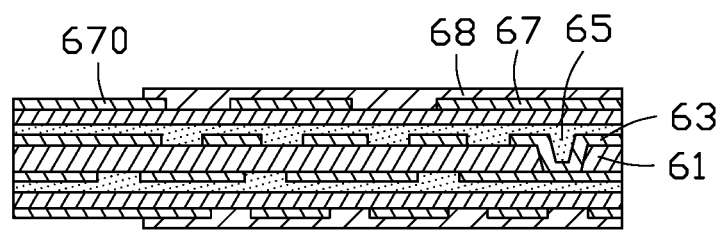
FIG. 22 is a diagrammatic view showing a second protective layer formed on the second outer wiring layer of FIG. 21 to obtain a second circuit board.

Block 118, referring to FIG. 22, a second circuit board 600 is provided. The second circuit board 600 includes a second base layer 61 and two second inner wiring layers 63 disposed on two opposite surfaces of the second base layer 61. The second circuit board 600 further includes a third adhesive layer 65, a third outer wiring layer 67, and a second protective layer 68 sequentially disposed on each second inner wiring layer 63. Each third outer wiring layer 67 includes a second pad 670 exposed from the second protection layer 68. The second base layer 61 can be made of same material as that of the first base layer 11. The second base layer 61 may also be made of a material which is different from that of the first base layer 11.

In an embodiment, the second circuit board 600 is manufactured as follows.

Figure 18:
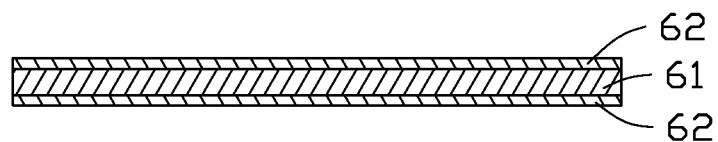
FIG. 18 is a diagrammatic view of an embodiment of a third double-sided copper clad laminate.

Referring to FIG. 18, a third double-sided copper clad laminate 60 is provided. The third double-sided copper clad laminate 60 includes the second base layer 61 and two fourth copper foil layers 62 disposed on two opposite surfaces of the second base layer 61.

Figure 19:
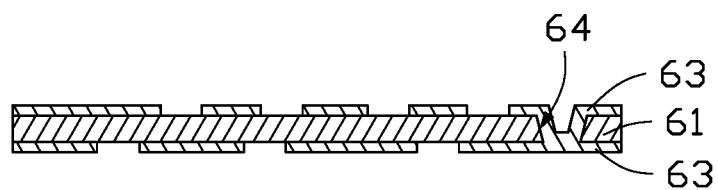
FIG. 19 is a diagrammatic view showing a fourth copper foil layer of the third double-sided copper clad laminate of FIG. 18 etched to obtain a second inner wiring layer.

Referring to FIG. 19, each fourth copper foil layer 62 is etched to form the second inner wiring layer 63. In an embodiment, the second inner wiring layer 63 is formed by a subtractive method, which includes steps of drilling the third double-sided copper clad laminate 60, surface treatment, copper electroplating, dry film covering, pattern transferring, and dry film removing. After drilling and copper electroplating, a third conductive blind hole 64 is formed in the second base layer 61. The two second inner wiring layers 63 are electrically connected to each other through the third conductive blind hole 64.

Figure 20:
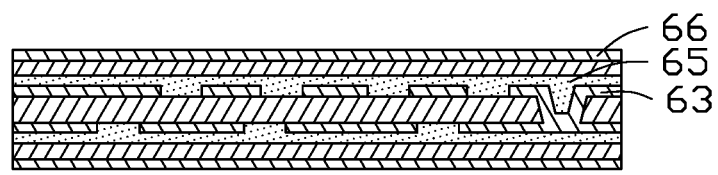
FIG. 20 is a diagrammatic view showing a third adhesive layer and a fifth copper foil layer formed on the second inner wiring layer of FIG. 19.
Figure 21:
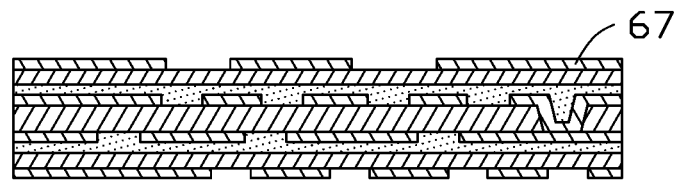
FIG. 21 is a diagrammatic view showing the fifth copper foil layer of FIG. 20 etched to obtain a second outer wiring layer.

Referring to FIGS. 20 and 21, a third adhesive layer 65 and a fifth copper foil layer 66 are disposed on each second inner wiring layer 63. Then, the fifth copper foil layer 66 is etched to form a third outer wiring layer 67. In another embodiment, at least one middle wiring layer (not shown) can also be added between the second inner wiring layer 63 and the second outer wiring layer 24, according to the number of wiring layers required in the second circuit board 600.

Referring to FIG. 22, the second protective layer 68 covers each third outer wiring layer 67, thereby obtaining the second circuit board 600.

Figure 23:
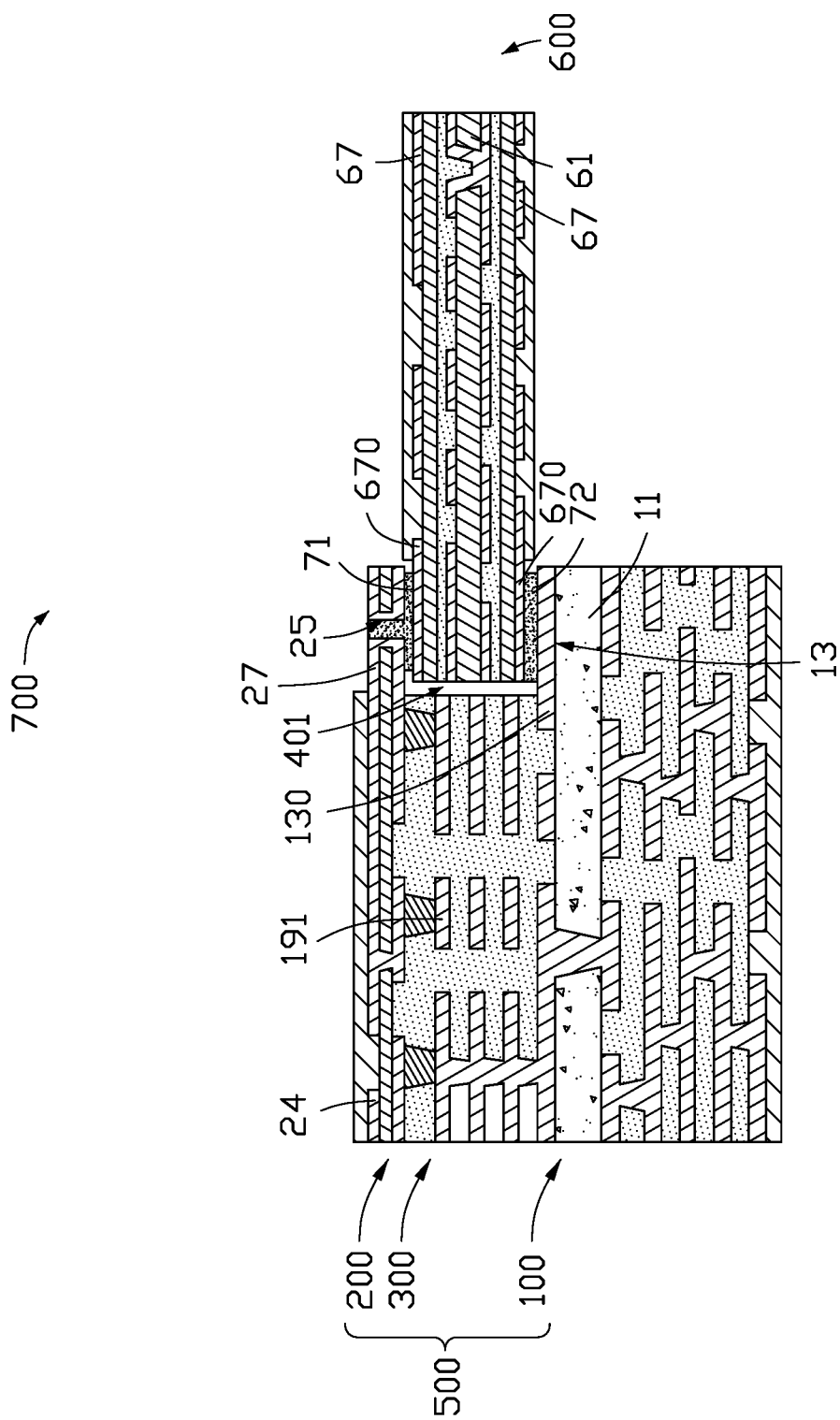
FIG. 23 is a diagrammatic view showing the second circuit board of FIG. 22 inserted into the first circuit board of FIG. 17 to obtain a board-to-board connecting structure.

Block 119, referring to FIG. 23, the release film 18 is removed. The second circuit board 600 is inserted into the receiving space 401 through the opening 4010 of the receiving space 401 (that is, the second circuit board 600 is disposed at the sidewall of the first circuit board 500). Such insertion causes the second pads 670 of the two third outer wiring layers 67 to respectively connect to the conductive via 25 and the first pad 130. Thus, the board-to-board connecting structure 700 is obtained.

In an embodiment, after the second circuit board 600 is inserted into the receiving space 401, a solder ball may be implanted in the conductive via 25 and irradiated with light. The solder ball melts and infills the conductive vias 25, and also infills an area between the connection area 27 and the second pad 670 to form a first conductive portion 71. The first conductive portion 71 enables the first circuit substrate 100 of the first circuit board 500 to be electrically connected to the second circuit board 600. The implanting and irradiating of the solder ball avoids deterioration in product performance by the high temperature of reflow soldering. Thus, as mentioned above, the base layer in the board-to-board connecting structure 700 can be made of insulating resin which is not resistant to high temperatures. Furthermore, a line spacing of the wiring layer in the connection area 27 surrounding the conductive via 25 is not restricted.

Furthermore, a second conductive portion 72 is also formed between the second pad 670 and the first pad 130. The second conductive portion 72 enables the second circuit substrate 200 of the first circuit board 500 to electrically connect to the second circuit board 600. The second conductive portion 72 may be made of a conductive paste, such as copper paste and a solder paste. The second conductive portion 72 may be formed by hot bar, printing, or welding.

In the present disclosure, since the second circuit board 600 is disposed at the sidewall of the first circuit board 500, no additional vertical thickness is added by the board-to-board connecting structure 700. The board-to-board connecting structure 700 can therefore be applied in a thin and bendable electronic device.

Referring to FIG. 23, an embodiment of a board-to-board connecting structure 700 is also provided. The board-to-board connecting structure 700 includes a first circuit board 500 and a second circuit board 600 electrically connected to the first circuit board 500.

The first circuit board 500 includes a first circuit substrate 100, a second adhesive layer 300, and a second circuit substrate 200 stacked together in that order. The first circuit substrate 100 includes a first base layer 11, and a first inner wiring layer 13 and a first outer wiring layer 191 sequentially disposed on the first base layer 11. The first inner wiring layer 13 includes a first pad 130. The second adhesive layer 300 and the first outer wiring layer 191 define a receiving space 401 exposing the first pad 130. The receiving space 401 has an opening 4010 at a sidewall of the first circuit board 500. The second circuit substrate 200 includes an insulating layer 21 and two second outer wiring layers 24 disposed on two opposite surfaces of the insulating layer 21. The second circuit substrate 200 defines a conductive via 25 electrically connecting the two second outer wiring layers 24. The conductive via 25 is disposed above the receiving space 401.

The second circuit board 600 includes a second base layer 61 and two third outer wiring layers 67 disposed on two opposite surfaces of the second base layer 61. Each third outer wiring layer 67 includes a second pad 670. The second circuit board 600 is inserted into the receiving space 401. The second pads 670 of the two third outer wiring layers 67 respectively connect to the conductive via 25 and the first pad 130.

In an embodiment, the second circuit substrate 100 includes a connection area 27 surrounding the conductive via 25. The connection area 27 is disposed above the receiving space 401 and corresponds to the second pad 670. The board-to-board connecting structure 700 further includes a first conducting portion 71 connecting the first circuit substrate 100 to the second circuit board 600. The first conductive portion 71 infills the conductive hole 25, and also infills an area between the connection area 27 and the second pad 670.

The board-to-board connecting structure 700 further includes a second conducting portion 72 connecting the second circuit substrate 200 to the second circuit board 600. The second conducting portion 72 is disposed between the second pad 670 and the second pad 130.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A board-to-board connecting structure, comprising:
a first circuit board comprising a first circuit substrate, an adhesive layer, and a second circuit substrate stacked in that order, the first circuit substrate comprising a first base layer, and a first inner wiring layer and a first outer wiring layer sequentially disposed on the first base layer, the first inner wiring layer comprising a first pad, the adhesive layer and the first outer wiring layer defining a receiving space for exposing the first pad, the receiving space having an opening on a sidewall of the first circuit board, the second circuit substrate comprising an insulating layer and two second outer wiring layers disposed on two opposite surfaces of the insulating layer, the second circuit substrate defining a conductive via electrically connecting the two second outer wiring layers to each other, the conductive via being disposed above the receiving space; and
a second circuit board comprising a second base layer and two third outer wiring layers disposed on two opposite surfaces of the second base layer, each of the third outer wiring layers comprising a second pad;
wherein the second circuit board is disposed in the receiving space, the second pads of the two third outer wiring layers respectively connect to the through via and the first pad.

2. The board-to-board connecting structure of claim 1, wherein the second circuit substrate comprises a connection area surrounding the conductive via, and the connection area is disposed above the receiving space and corresponds to the second pad.

3. The board-to-board connecting structure of claim 2, further comprising:
a first conducting portion configured to connect the first circuit substrate to the second circuit board, the first conducting portion filling in the conductive via, and in an area between the connection area and the second pad.

4. The board-to-board connecting structure of claim 1, further comprising:
a second conducting portion configured to connect the second circuit substrate to the second circuit board, the second conducting portion disposed between the second pad and the first pad.

5. The board-to-board connecting structure of claim 1, wherein the first circuit board further comprises a first protection layer on the first outer wiring layer and the second outer wiring layer.

6. A method for manufacturing a board-to-board connecting structure, comprising:
providing a first circuit board, the first circuit board comprising a first circuit substrate, an adhesive layer, and a second circuit substrate stacked in that order, the first circuit substrate comprising a first base layer, and a first inner wiring layer and a first outer wiring layer sequentially disposed on the first base layer, the first inner wiring layer comprising a first pad, a release film being disposed on the first pad, the adhesive layer and the first outer wiring layer defining a receiving space for exposing the release film, the receiving space having an opening on a sidewall of the first circuit board, the second circuit substrate comprising an insulating layer and two second outer wiring layers disposed on two opposite surfaces of the insulating layer, the second circuit substrate defining a conductive via electrically connecting the two second outer wiring layers to each other, the conductive via being disposed above the receiving space;
providing a second circuit board, the second circuit board comprising a second base layer and two third outer wiring layers disposed on two opposite surfaces of the second base layer, each of the third outer wiring layers comprising a second pad; and
removing the release film, and inserting the second circuit board into the receiving space through the opening, to cause the second pads of the two third outer wiring layers to respectively connect to the through via and the first pad, thereby obtaining the board-to-board connecting structure.

7. The method of claim 6, wherein the second circuit substrate comprises a connection area surrounding the conductive via, and the connection area is disposed above the receiving space and corresponds to the second pad.

8. The method of claim 7, wherein after inserting the second circuit board into the receiving space, the method further comprises:
filling a solder ball in the conductive via; and
irridiating the solder ball, to cause the solder ball to melt and fill in the conductive via and further fill in an area between the connection area and the second pad, thereby forming a first conductive portion configured to connect the first circuit substrate to the second circuit board.

9. The method of claim 6, wherein after inserting the second circuit board into the receiving space, the method further comprises:
forming a second conductive portion between the second pad and the first pad, the second conductive portion configured to connect the second circuit substrate to the second circuit board.

10. The method of claim 6, wherein a method for manufacturing the first circuit board comprises:

providing the first circuit substrate, the first circuit substrate defining a first window above the release film;
providing the second circuit substrate;
providing the adhesive layer, the adhesive layer defining a second window and comprising a conductive block spaced apart from the second window;
laminating the adhesive layer and the second circuit substrate sequentially on the first outer wiring layer of the first circuit substrate, to cause the second window and the first window to connect to each other to form the receiving space, and the conductive via to connect to the receiving space; and
pressing the first circuit substrate, the adhesive layer, and the second circuit substrate after lamination together, to cause the adhesive layer to connect the first circuit substrate to the second circuit substrate, and the conductive block of the adhesive layer to connect the second outer wiring layer of the second circuit substrate and the first outer wiring layer of the first circuit substrate.

11. The method of claim 10, wherein orthogonal projections of the first window and the second window on the first base layer overlap with each other, and an orthogonal projection of the conductive via on the first base layer is within the orthogonal projection of the first window on the first base layer.

12. The method of claim 10, wherein the conductive block is made of a conductive paste.

13. The method of claim 10, wherein an intermediate body is obtained after pressing the first circuit substrate, the adhesive layer, and the second circuit substrate after laminating, the intermediate body comprises a waste area at a side of the receiving space and a product area besides the waste area, the first pad, the release film, and the connection area are disposed in the product area;
the method further comprises:
removing the waste area to cause the receiving space to form an opening, wherein the remaining product area forms the first circuit board, and the opening is disposed on a sidewall of the first circuit board.

14. The method of claim 13, further comprising:
disposing a first protection layer on the first outer wiring layer and the second outer wiring layer on opposite sides of the intermediate body.

* * * * *